United States Patent
Purden et al.

(10) Patent No.: US 8,680,936 B2
(45) Date of Patent: Mar. 25, 2014

(54) SURFACE MOUNTABLE MICROWAVE SIGNAL TRANSITION BLOCK FOR MICROSTRIP TO PERPENDICULAR WAVEGUIDE TRANSITION

(75) Inventors: George J. Purden, Westlake Village, CA (US); David W. Zimmerman, Fishers, IN (US)

(73) Assignee: Delphi Technologies, Inc., Troy, MI (US)

( * ) Notice: Subject to any disclaimer, the term of this patent is extended or adjusted under 35 U.S.C. 154(b) by 200 days.

(21) Appl. No.: 13/299,410

(22) Filed: Nov. 18, 2011

(65) Prior Publication Data

US 2013/0127562 A1    May 23, 2013

(51) Int. Cl.
*H03H 5/00*    (2006.01)
*H01P 3/08*    (2006.01)

(52) U.S. Cl.
USPC .............. 333/26; 333/208; 333/246; 333/254

(58) Field of Classification Search
USPC .................................... 333/208, 248, 254, 26
See application file for complete search history.

(56) References Cited

U.S. PATENT DOCUMENTS

| | | | |
|---|---|---|---|
| 4,562,416 A * | 12/1985 | Sedivec | 333/26 |
| 4,716,386 A | 12/1987 | Lait | |
| 5,414,394 A * | 5/1995 | Gamand et al. | 333/26 |
| 5,770,981 A | 6/1998 | Koizumi et al. | |
| 5,982,250 A * | 11/1999 | Hung et al. | 333/26 |
| 7,276,988 B2 * | 10/2007 | Stoneham | 333/26 |
| 7,498,896 B2 | 3/2009 | Shi | |
| 8,089,327 B2 * | 1/2012 | Margomenos et al. | 333/26 |
| 8,368,482 B2 * | 2/2013 | Sano | 333/26 |
| 2003/0231078 A1 * | 12/2003 | Koriyama et al. | 333/26 |
| 2007/0052504 A1 * | 3/2007 | Fujita | 333/238 |
| 2007/0229380 A1 | 10/2007 | Oota et al. | |
| 2008/0266196 A1 | 10/2008 | Shi | |
| 2011/0037530 A1 | 2/2011 | Mangalahgari et al. | |

FOREIGN PATENT DOCUMENTS

| | | |
|---|---|---|
| EP | 1367668 A1 * | 12/2003 |
| JP | 2001085912 A * | 3/2001 |
| JP | 2005318632 A * | 11/2005 |

* cited by examiner

*Primary Examiner* — Robert Pascal
*Assistant Examiner* — Kimberly Glenn
(74) *Attorney, Agent, or Firm* — Lawrence D. Hazelton

(57) ABSTRACT

A surface mountable transition block for perpendicular transitions between a microstrip or stripline and a waveguide. The transition block configuration allows for a reduction in the overall cost of a microwave circuit assembly because the circuit board to which the transition block is attached can be an FR-4 type circuit board as opposed to more expensive microwave circuit board materials.

12 Claims, 2 Drawing Sheets

SURFACE MOUNTABLE MICROWAVE SIGNAL TRANSITION BLOCK FOR MICROSTRIP TO PERPENDICULAR WAVEGUIDE TRANSITION

TECHNICAL FIELD OF INVENTION

This disclosure generally relates to microwave circuit assemblies, and more particularly relates to a surface mountable transition block for perpendicular transitions between a microstrip or stripline and a waveguide.

BACKGROUND OF INVENTION

Mass-marketing of devices operating at millimeter wavelength frequencies encourages design approaches that reduce manufacturing and material costs. In particular, radar systems for automotive applications are especially cost sensitive applications. Microwave circuit board materials such as hydrocarbon/ceramic or PTFE/ceramic laminates materials exhibit excellent microwave properties, but are more expensive and so less desirable than generic epoxy-resin (FR-4) circuit boards.

SUMMARY OF THE INVENTION

In accordance with one embodiment, a transition block configured to be surface mount attached to a surface of a circuit board and effective to couple a microwave radio frequency signal between a microstrip arranged on the surface and a waveguide oriented perpendicular to the surface is provided. The transition block includes a top metal layer, a first dielectric layer, a middle metal layer, a second dielectric layer, a bottom metal layer, an electrical connection means, and a plurality of thru-vias. The first dielectric layer underlies the top metal layer. The middle metal layer underlies the first dielectric layer. The middle metal layer defines a probe extending from a first location proximate to an edge of the transition block to a second location proximate to a central region of the transition block. The second dielectric layer underlies the middle metal layer. The bottom metal layer underlies the second dielectric layer. The bottom metal layer defines a first opening aligned with the first location and a second opening aligned with the central region. The electrical connection means forms an electrical connection from the first opening to the first location, and makes electrical contact therewith the probe. The plurality of thru-vias are arranged about the central region and in electrical contact with the top metal layer and the bottom metal layer.

In another embodiment, a microwave circuit assembly is provided. The microwave circuit assembly includes a circuit board, a microstrip, a waveguide, and a transition block. The microstrip is arranged on a surface of the circuit board. The waveguide is oriented perpendicular to the surface. The transition block is surface mount attached to the surface and is effective to couple a microwave radio frequency signal between the microstrip arranged and the waveguide. The transition block includes a top metal layer, a first dielectric layer, a middle metal layer, a second dielectric layer, a bottom metal layer, an electrical connection means, and a plurality of thru-vias. The first dielectric layer underlies the top metal layer. The middle metal layer underlies the first dielectric layer. The middle metal layer defines a probe extending from a first location proximate to an edge of the transition block to a second location proximate to a central region of the transition block. The second dielectric layer underlies the middle metal layer. The bottom metal layer underlies the second dielectric layer. The bottom metal layer defines a first opening aligned with the first location and a second opening aligned with the central region. The electrical connection means forms an electrical connection from the first opening to the first location, and makes electrical contact therewith the probe. The plurality of thru-vias are arranged about the central region and in electrical contact with the top metal layer and the bottom metal layer.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
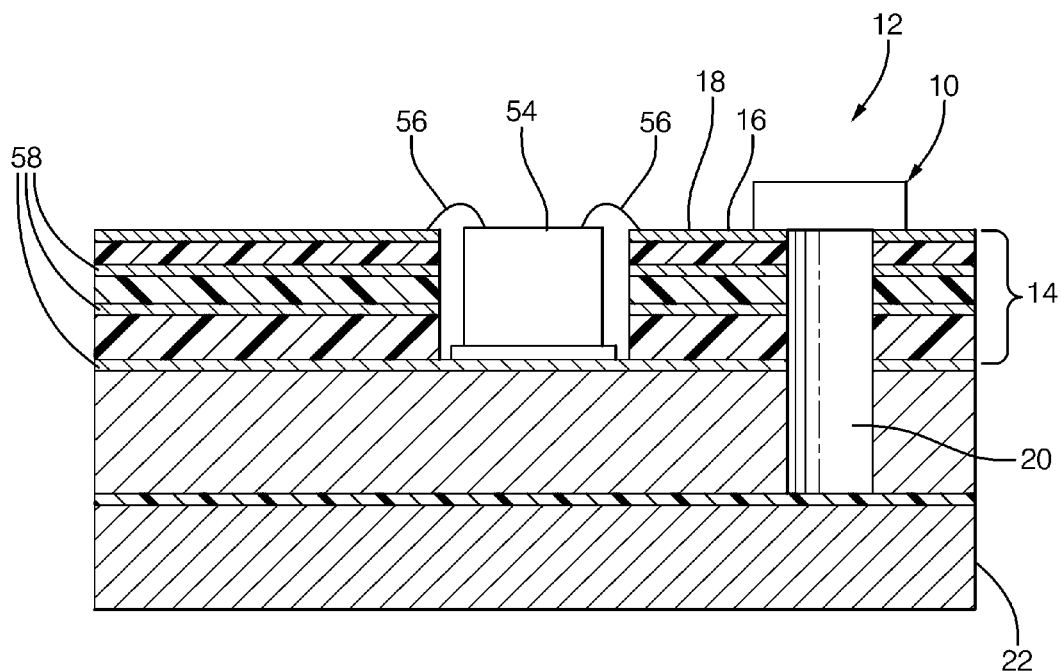
FIG. 1 is a side view of a microwave circuit assembly that includes a transition block in accordance with one embodiment.

FIG. 1 illustrates a non-limiting example of a transition block 10 that allows for the manufacture of a microwave circuit assembly 12 using a lower cost epoxy resin (e.g. FR-4) type circuit board 14 when perpendicular transitions between a microstrip 16 arranged on a surface 18 of the circuit board 14 and a waveguide 20 oriented perpendicular to the surface 18 are desired. The circuit board assembly may include other devices such as a radio frequency integrated circuit 54 (RFIC 54) interconnected to the circuit board 14 by way of a wire bond 56. Alternatively, the RFIC 54 may be flip-chip mounted to the circuit board 14. FR-4 is a widely accepted international grade designation for fiberglass reinforced epoxy laminates that are flame retardant. An FR-4 circuit board may include other metal layers 58 within the circuit board 14 or opposite the surface 18. The waveguide 20 is useful to direct microwave energy to and from an antenna 22 that may be configured to receive or transmit microwave energy from/to free space.

In general, the transition block 10 is configured to be surface mount attached to the surface 18 of the circuit board 14. Surface mount attachment of electrical components to circuit boards is a well-known process. A typical process dispenses solder paste in a pattern onto a circuit board and reflows the solder paste to form solder joints between the components and the circuit board. As such, the characterization of the transition block 10 as being configured to be surface mount attached to the circuit board 14 excludes any arrangements of metal and dielectric layer to form a transition block that is not comparable to a surface mount type component, for example a transition block that is built into or integrated into a circuit board is not comparable to the transition block 10. Configuring the transition block 10 as a separate surface mount component is advantageous because the entirety of the circuit board 14 does not need to be fabricated using the typically more costly materials necessary to form a transition.

Figure 2:
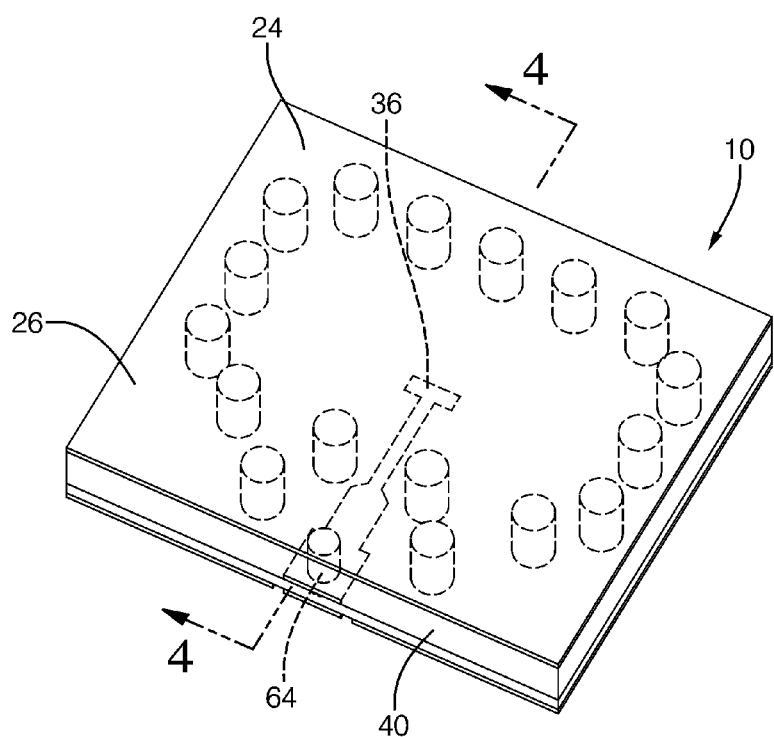
FIG. 2 is a perspective top view of the transition block of FIG. 1 in accordance with one embodiment.
Figure 3:
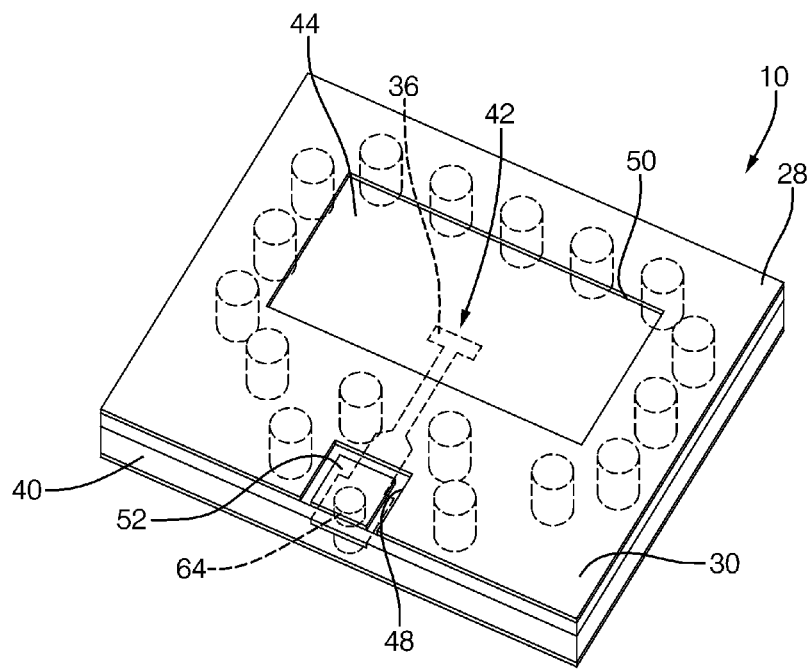
FIG. 3 is a perspective bottom view of the transition block of FIG. 1 in accordance with one embodiment.

FIGS. 2 and 3 illustrate a non-limiting example of the transition block 10. For the purpose of visualization and not limitation, the size of the transition block 10 is 4.0 millimeters by 3.0 millimeters by 0.6 millimeters. However, those skilled in the art will recognize that the example dimensions and materials suggested herein are selected/adjusted based on the operating frequency of the application where the transition block is to be used. The transition block describe herein is designed for a nominal operating frequency of 77 Giga-Hertz (GHz)

The transition block 10 includes a top metal layer 24 that may define the top surface 26 of the transition block 10. However, additional protection for the top metal layer 24 is contemplated. Additional protection may be by way of a film or coating overlying the top metal layer 24, for example, a surface coating that provides for a marking surface so an identification number or identification mark could be applied to the transition block 10. The top metal layer 24 may be suitably formed of copper or copper alloy. However other electrically conductive materials may also be suitable. A suitable thickness of copper is 17.5 micrometers (um), commonly referred to as half-ounce copper. The transition block 10 may also include a bottom metal layer 28 that may define a bottom surface 30 of the transition block 10. Like the top metal layer 24, the bottom metal layer 28 may also be formed of half-ounce copper. More details about features defined by the bottom metal layer 28 are given below.

Figure 4:
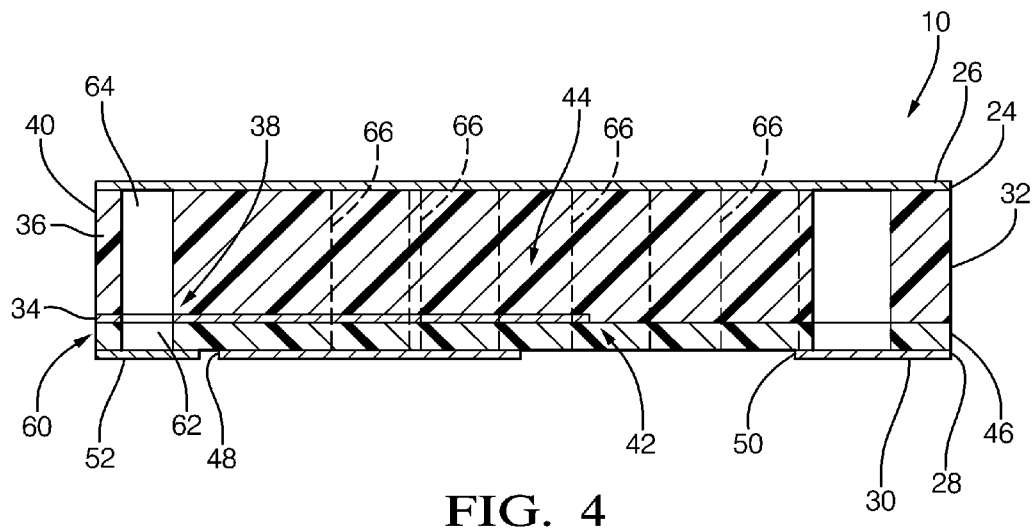
FIG. 4 is a sectional side view of the transition block of FIG. 1 in accordance with one embodiment.

FIG. 4 further illustrates the transition block 10 illustrated in FIGS. 2 and 3 by way of a sectional side view. The transition block 10 may include a first dielectric layer 32 underlying the top metal layer 24. The first dielectric layer is preferably formed from sheets of 0.5 millimeter thick RO4350B available from Rogers Corporation in Rogers, Conn., USA. The RO4350B material is available with half-ounce copper. However, other materials may be suitable, including multiple layers of different materials to form the first dielectric layer 32.

The transition block 10 may include a middle metal layer 34 underlying the first dielectric layer 32. Like the top metal layer 24 and the bottom metal layer 28, the middle metal layer 34 may be suitably formed of half-ounce copper. If the middle metal layer is purchased in sheet form, possibly already attached to the first dielectric layer 32, portions of the middle metal layer 34 may be removed using known photo-etching processes so that the middle metal layer 34 defines a probe 36 extending from a first location 38 proximate to an edge 40 of the transition block 10 to a second location 42 proximate to a central region 44 of the transition block 10. The overall shape of the probe 36 is determined based on desired operating characteristics of the transition block 10 using design rules known to those skilled in the art.

Continuing to refer to FIG. 4, the transition block 10 may include a second dielectric layer 46 underlying the middle metal layer 34. A suitable material for the second dielectric layer 46 is 0.1 millimeter thick RO4450B, also available from Rogers Corporation. However, other materials may be suitable to form the middle dielectric layer 34. The second dielectric layer 46 may be attached to the first dielectric layer 32 in the areas where the middle metal layer 34 is void or not present by an adhesive (not shown).

The transition block 10 may include a bottom metal layer 28 underlying the second dielectric layer 46. Photo-etching of the bottom metal layer 28 may be used to define features such as a first opening 48 aligned with the first location 38 in order to isolate a portion of the bottom metal layer 28 to form a contact pad 52 that is substantially coplanar with the bottom metal layer. Having the exposed surfaces of the contact pad 52 and the bottom metal layer 28 be coplanar is desirable so the transition block 10 is level with the circuit board 14 when the transition block is surface mount attached to the surface 18. To facilitate soldering of the transition block 10 to the circuit board 14, the contact pad 52 and the bottom metal layer 28 may have a surface finishes suitable for soldering, such as tin plating for example. If an alternative attachment method other than soldering is desired, conductive epoxy for example, then the contact pad 52 and the bottom metal layer 28 may have other surface finishes known to those skilled in the art suitable for the selected alternative attachment method used for surface mount attachment of the transition block 10 to a circuit board 14.

The bottom metal layer 28 may also be photo-etched or otherwise processed to define a second opening 50 aligned with the central region 44. The second opening 50 will, in general, be aligned with the wave guide 20 when the transition block 10 is surface mount attached to the circuit board 14 so that microwave energy is efficiently transferred between the wave guide 20 and the probe 36.

The transition block 10 may include an electrical connection means 60 that forms an electrical connection from the contact pad 52 in the first opening 48 to the probe 36 at the first location 38. By way of example and not limitation, the electrical connection means 60 may be a blind-via 62 that extends only through the second dielectric layer 46 to form an electrical path between the contact pad 52 and the first location 38 end of the probe 36. As suggested in the drawings, the electrical connection means 60 may be a thru-via 64 that extends through the first dielectric layer 32 and the second dielectric layer 46, and makes electrical contact with the top metal layer 24, the probe 36, and the contact pad 52. Alternative means are envisioned, such a removing a portion of the first dielectric layer 32 around the first location 38 so the end of the probe 36 is exposed, and then making a direct wire bond connection from the RFIC 54 to the probe 36.

The transition block 10 may include a plurality of thru-vias 66 arranged about the central region 44 and in electrical contact with the top metal layer 24 and the bottom metal layer 28 by extending through the first dielectric layer and the second dielectric layer. It should be understood that the plurality of thru-vias 66 do not make electrical contact with the probe 36. The arrangement of top metal layer 24, bottom metal layer 28 and the plurality of thru-vias 66 cooperate to form a microwave backstop for the transition block 10

Accordingly, a transition block 10 configured to be surface mount attached to a surface 18 of a circuit board 14 and effective to couple a microwave radio frequency signal between a microstrip 16 arranged on the surface 18 and a waveguide 20 oriented perpendicular to the surface 18 is provided. The transition block allows for a reduction in the overall cost of a microwave circuit assembly 12 because the circuit board 14 to which the transition block is attached can be an FR-4 type circuit board as opposed to more expensive microwave circuit board formed of, for example, low temperature co-fired ceramic (LTCC), polytetrafluoroethylene (PTFE)/ceramic, or hydrocarbon/ceramic materials. The cost of using a circuit board 14 formed of these specialty materials can account for a substantial portion of a microwave circuit assembly 12.

While this invention has been described in terms of the preferred embodiments thereof, it is not intended to be so limited, but rather only to the extent set forth in the claims that follow.

We claim:

1. A transition block configured to be surface mount attached to a surface of a circuit board and effective to couple a microwave radio frequency signal between a microstrip arranged on the surface and a waveguide oriented perpendicular to the surface, said transition block comprising:
- a top metal layer;
- a first dielectric layer underlying the top metal layer;
- a middle metal layer underlying the first dielectric layer, wherein the middle metal layer defines a probe extending from a first location proximate to an edge of the transition block to a second location proximate to a central region of the transition block;
- a second dielectric layer underlying the middle metal layer;
- a bottom metal layer underlying the second dielectric layer, wherein the bottom metal layer defines a first opening aligned with the first location and a second opening aligned with the central region;
- an electrical connection means that forms an electrical connection from the first opening to the first location, and makes electrical contact therewith the probe; and
- a plurality of thru-vias arranged about the central region and in electrical contact with the top metal layer and the bottom metal layer.

2. The transition block in accordance with claim 1, wherein the top metal layer defines a top surface of the transition block.

3. The transition block in accordance with claim 1, wherein the bottom metal layer defines a bottom surface of the transition block.

4. The transition block in accordance with claim 1, wherein the plurality of thru-vias extend through the first dielectric layer and the second dielectric layer.

5. The transition block in accordance with claim 1, wherein the electrical connection means extends through the second dielectric layer.

6. The transition block in accordance with claim 1, wherein the electrical connection means comprises a blind via through the second dielectric layer.

7. The transition block in accordance with claim 1, wherein the electrical connection means comprises a thru-via that extends through the first dielectric layer and the second dielectric layer, and makes electrical contact with the top metal layer.

8. The transition block in accordance with claim 1, wherein the electrical connection means comprises a contact pad substantially coplanar with the bottom metal layer.

9. The transition block in accordance with claim 8, wherein the contact pad and the bottom metal layer have surface finishes suitable for surface mount attachment of the transition block to the circuit board.

10. The transition block in accordance with claim 9, wherein the surface mount attachment is suitable to form an electrical connection from the contact pad and the bottom metal layer to the circuit board.

11. The transition block in accordance with claim 1, wherein the second dielectric layer contacts the first dielectric layer where the middle metal layer is void.

12. A microwave circuit assembly comprising:
- a circuit board;
- a microstrip arranged on a surface of the circuit board;
- a waveguide oriented perpendicular to the surface;
- a transition block surface mount attached to the surface and effective to couple a microwave radio frequency signal between the microstrip arranged and the waveguide, said transition block comprising:
- a top metal layer;
- a first dielectric layer underlying the top metal layer;
- a middle metal layer underlying the first dielectric layer, wherein the middle metal layer defines a probe extending from a first location proximate to an edge of the transition block to a second location proximate to a central region of the transition block;
- a second dielectric layer underlying the middle metal layer;
- a bottom metal layer underlying the second dielectric layer, wherein the bottom metal layer defines a first opening aligned with the first location and a second opening aligned with the central region;
- an electrical connection means that forms an electrical connection from the first opening to the first location, and makes electrical contact therewith the probe; and
- a plurality of thru-vias arranged about the central region and in electrical contact with the top metal layer and the bottom metal layer.

* * * * *